US012660719B2

(12) United States Patent     (10) Patent No.:   US 12,660,719 B2
Dietz et al.     (45) Date of Patent:   Jun. 16, 2026

(54) APPARATUS AND SYSTEM FOR MULTI-PURPOSE MACROS FOR VERTICAL DIE INTERCONNECTS

(71) Applicant: Advanced Micro Devices, Inc., Santa Clara, CA (US)

(72) Inventors: Carl Dean Dietz, Longmont, CO (US); Russell Schreiber, Austin, TX (US); Eric Busta, Fort Collins, CO (US); Stephen Dussinger, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 180 days.

(21) Appl. No.: 18/752,453

(22) Filed: Jun. 24, 2024

(65) Prior Publication Data

US 2025/0391815 A1    Dec. 25, 2025

(51) Int. Cl.
| | |
|---|---|
| *H10W 20/20* | (2026.01) |
| *H03K 3/037* | (2006.01) |
| *H10W 90/00* | (2026.01) |

(52) U.S. Cl.
CPC ............ *H10W 90/00* (2026.01); *H03K 3/037* (2013.01); *H10W 20/20* (2026.01)

(58) Field of Classification Search
CPC ... H10W 20/20; H10W 20/00; H10W 20/021; H10W 20/025; G06F 13/00; G06F 13/14
USPC ................. 327/199; 257/774, 909, E23.001, 257/E23.174
See application file for complete search history.

(56) References Cited

U.S. PATENT DOCUMENTS

| | | | | |
|---|---|---|---|---|
| 12,469,783 B2 * | 11/2025 | MacFaden | .............. | G06F 11/27 |
| 12,512,793 B2 * | 12/2025 | Kim | ...................... | H03F 1/0288 |

\* cited by examiner

*Primary Examiner* — Hai L Nguyen
(74) *Attorney, Agent, or Firm* — Greenberg Traurig, LLP

(57) ABSTRACT

A macro cell includes one or more vertical die interconnects that vertically span the macro cell to transmit a data signal. The macro cell also includes one or more isolation features configured to manage a power of the macro cell by controlling a transmission of the data signal. Additionally, the macro cell includes one or more flip-flops configured to control a timing of the transmission of the data signal through the one or more vertical die interconnects. Various other apparatuses and systems are also disclosed.

20 Claims, 9 Drawing Sheets

APPARATUS AND SYSTEM FOR MULTI-PURPOSE MACROS FOR VERTICAL DIE INTERCONNECTS

BACKGROUND

In computing systems, electrical circuits can be designed on separate components, such as a die or a chip, and combined to create more complex systems. Integrated circuits can be customized and designed to perform specific functions, and multiple components can be modularly combined to increase performance. For example, macros or cells can contain specific logic that can be modularly added to a die. In some computing systems, similar components can be combined as an interconnected stack, with the combination acting as a single device. For example, dies can be stacked together to create a three-dimensional integrated circuit that reduces the overall footprint of the components and power consumption while increasing computing power or memory.

BRIEF DESCRIPTION OF THE DRAWINGS

The accompanying drawings illustrate a number of example implementations and are a part of the specification. Together with the following description, these drawings demonstrate and explain various principles of the present disclosure.

Figure 1:
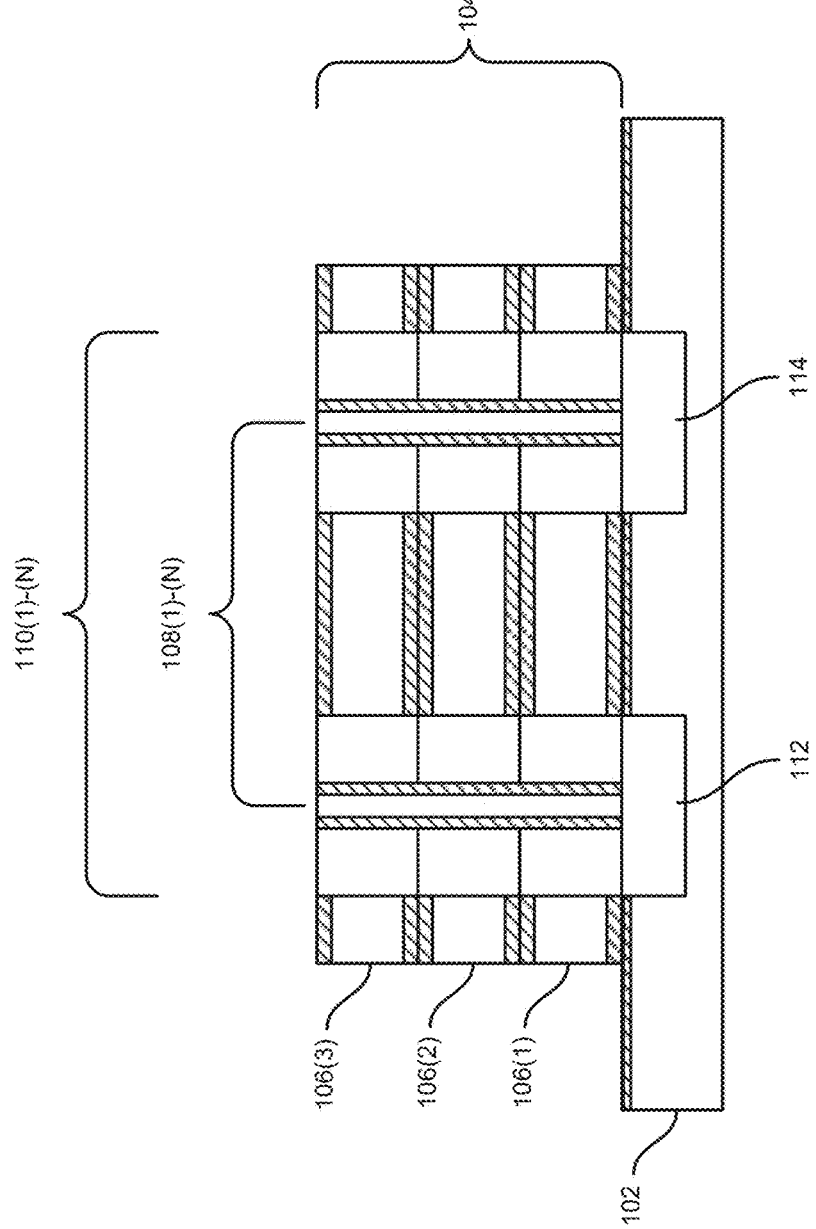
FIG. 1 illustrates a side view of an example three-dimensional integrated circuit with exemplary multi-purpose macro cells integrated with each die.
Figure 1:

Throughout the drawings, identical reference characters and descriptions indicate similar, but not necessarily identical, elements. While the example implementations described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to apparatuses and systems for multi-purpose macros for vertical die interconnects, particularly for use in three-dimensional integrated circuits. As described below, by vertically stacking integrated circuits or dies, a computing system can maintain a smaller circuit footprint and reduce power consumption in comparison to many two-dimensional configurations. For example, a three-dimensional integrated circuit of multiple, identical stacked die can replace a horizontal die configuration of a much larger footprint. In this example, the vertically stacked dies can be electronically interconnected, such as by macros or cells integrated into each die. To send data through the stack, vertical die interconnects can transmit data to each layer of dies.

However, macros are often designed for very specific purposes, and there are generally no options to configure the macros afterward. For example, a macro cell can be designed to send a specific type of static signal from one point to another with no flexibility to configure for different paths or for analog signals. Due to the specific paths that are designed, different macro cells are needed for different die positions in a stack. For example, a macro cell on a die at the top or outermost layer of a stack may only receive data and not send data, while a macro cell on a die at the bottom of the stack would need to be designed to send and receive data from the base die. Each design would then need to be manufactured differently. Additionally, these designs may not account for potential errors, such as potential shorts in vertical die interconnects that would disrupt signals. Thus, a more flexible design for macro cells is needed to improve the efficiency of manufacturing and the range of uses of stacked dies.

In some implementations, the disclosed multi-purpose macro cell includes connections, such as vertical die interconnects, to interface with other dies in a stack. In these implementations, the vertical die interconnects can transmit data signals between dies, as well as between layers of a macro cell or a single die, for general purpose input and output. In some non-limiting examples, the disclosed macro cell can utilize dual vertical die interconnects to provide redundancy against vertical die interconnects with open-circuit faults. In these examples, a pass gate can be added between dual vertical die interconnects to enable repair of vertical die interconnect shorts. In a non-limiting example, the disclosed vertical die interconnect macro cell can include isolation and multiplexing, or "muxing," features to directly pass a received signal to a next layer. In some non-limiting examples, the signal can pass through a flip-flop into the local die, which performs additional processing before driving the signal on to the next layer. By implementing a flip-flop for signals such as high-frequency synchronous signals, the disclosed macro cell can control a timing of incoming and outgoing data signals to ensure timing closure. In non-limiting examples, the term "timing closure" refers to a process to ensure signals arrive within an expected window for a die or chip. In other examples, signals that do not have timing issues, such as some asynchronous or low-frequency signals, can bypass the flip-flop directly to the circuits of the local die. In another non-limiting example, multiplexing features, such as a transmission gate multiplexer, can enable the disclosed macro cell to process analog signals by bypassing the macro cell circuitry.

Furthermore, a computing system can include a three-dimensional integrated circuit. In some implementations, the three-dimensional integrated circuit can include multiple, stacked dies, each with vertical die interconnect macro cells to drive signals up and down the stack. These stacked dies can be identical or different, with the general purpose macro cells capable of adjusting to differences in the dies. For example, data from vertical die interconnects can be received at a first die layer from a base die, either synchronously or asynchronously, and the local die can use the received signal. The macro cell on the local die can then output the original signal, a buffered version of the original signal, a locally modified version of the signal, or a new synchronous or asynchronous signal to the next vertically adjacent die, with a macro cell on the next die receiving the output signal. Additionally, by incorporating isolation features to control power in a die, the disclosed macro cell can provide electrical isolation from a vertically adjacent die. For example, isolation features can provide protection while the various die in the stack are powering up or down. In another non-limiting example, isolation features can hold a signal when a die is the highest die in a stack, with no adjacent die to receive the signal. In these examples, the same macro cell can be used for several different functions, thereby saving time and effort in constructing macro cells and dies. Thus, the disclosed apparatuses and systems integrate general purpose macros into integrated circuit dies and three-dimensional die stacks for improved flexibility of signal routing.

As will be described in greater detail below, the present disclosure describes various apparatuses and systems for multi-purpose vertical die interconnect macros. In one implementation, a macro cell includes one or more vertical die interconnects that vertically span the macro cell to transmit a data signal. The macro cell also includes one or more isolation features configured to manage a power of the macro cell by controlling a transmission of the data signal. Additionally, the macro cell includes one or more flip-flops configured to control a timing of the transmission of the data signal through the vertical die interconnects.

In one example, the one or more vertical die interconnects include one or more dual vertical die interconnects configured to provide redundancy against an open-circuit fault. In this example, a dual vertical die interconnect includes a pass gate configured to bypass a vertical die interconnect short.

In one example, an isolation feature manages the power of the macro cell by isolating the data signal at a local integrated circuit and/or by routing the data signal based on a type of the data signal. In this example, a flip-flop controls the timing of the transmission of the data signal by capturing the data signal and/or by capturing a signal from the local integrated circuit. In this example, the macro cell further includes a flip-flop bypass configured to bypass the flip-flop. In this example, the macro cell further includes a receiver configured to send the data signal to the local integrated circuit.

In one example, the macro cell further includes a transmission gate multiplexer configured to process analog signals by bypassing a circuit of the macro cell.

In one implementation, an integrated circuit includes a set of electronic circuits disposed on a semiconductor material. The integrated circuit also includes one or more macro cells electronically integrated with the set of electronic circuits on the semiconductor material, wherein a macro cell includes one or more vertical die interconnects that vertically spans the integrated circuit to transmit a data signal, one or more isolation features configured to manage a power of the integrated circuit by controlling a transmission of the data signal, and one or more flip-flops configured to control a timing of the transmission of the data signal through the vertical die interconnects.

In one example, the set of electronic circuits is configured to receive the data signal from the macro cell, modify the data signal, output the modified data signal to a pipeline flip-flop of the integrated circuit, and output the modified data signal to the macro cell.

In one example, the data signal includes a high-frequency signal, a low-frequency signal, a high-speed signal, a low-speed signal, a synchronous signal, an asynchronous signal, a static signal, and/or an analog signal. In this example, the integrated circuit further includes a transmission gate multiplexer configured to multiplex the analog signal to output the analog signal through the one or more vertical die interconnects to a vertically adjacent integrated circuit by bypassing the macro cell. In this example, an isolation feature and a multiplexing signal drive the data signal through the one or more vertical die interconnects to the vertically adjacent integrated circuit. In this example, the isolation feature electrically isolates the integrated circuit from the vertically adjacent integrated circuit by disabling a driver for the one or more vertical die interconnects, disabling an output driver for the integrated circuit, disabling a faulty vertical die interconnect, or disabling a faulty macro cell. In this example, the macro cell is further configured to output the data signal through the one or more vertical die interconnects to the vertically adjacent integrated circuit. In this example, the integrated circuit further includes a flip-flop bypass configured to route the asynchronous signal to bypass the flip-flop.

In one implementation, a three-dimensional integrated circuit includes a base die. The three-dimensional integrated circuit also includes a stack of two or more dies electronically coupled to an interface of the base die, wherein a die includes a set of electronic circuits disposed on a semiconductor material and one or more macro cells electronically integrated with the set of electronic circuits on the semiconductor material. In this implementation, a macro cell includes one or more vertical die interconnects that vertically span the die to interconnect to other dies to transmit a data signal, one or more isolation features configured to manage a power of the die by controlling a transmission of the data signal, and one or more flip-flops configured to control a timing of the transmission of the data signal through one or more vertical die interconnects.

In one example, the base die includes one or more output cells configured to transmit the data signal to the stack and one or more input cells configured to receive the data signal from the stack.

In one example, the macro cell is configured to transmit the data signal to a vertically adjacent die and receive the data signal from the vertically adjacent die.

In one example, the three-dimensional integrated circuit further includes an outermost die of the stack, wherein the isolation feature of the outermost die manages the power of the outermost die by disabling an output driver for the outermost die.

Features from any of the implementations described herein can be used in combination with one another in accordance with the general principles described herein. These and other implementations, features, and advantages will be more fully understood upon reading the following detailed description in conjunction with the accompanying drawings and claims.

The following will provide, with reference to FIG. 1, detailed descriptions of an example three-dimensional integrated circuit with exemplary multi-purpose macro cells integrated with each die. Detailed descriptions of a circuit diagram of an exemplary base die broadcasting data to an exemplary die stack through the use of exemplary multi-purpose macro cells will be provided in connection with FIG. 2. In addition, detailed descriptions of processing example types of data through a die using the example multi-purpose macro cell of FIG. 2 will be provided in connection with FIGS. 3-6. Furthermore, detailed descriptions of a circuit diagram of an exemplary base die receiving data from an exemplary die stack through the use of exemplary multi-purpose macro cells will be provided in connection with FIG. 7. Detailed descriptions of processing example types of data through a die using the example multi-purpose macro cell of FIG. 7 will also be provided in connection with FIGS. 8-9.

FIG. 1 illustrates a side view of an example three-dimensional integrated circuit 100 with exemplary macro cells 110(1)-(N) integrated with dies 106(1)-(3). In non-limiting examples, the terms "macro," "cell," and "macro cell" refer to a logic block around which other circuitry of a chip can be designed. In non-limiting examples, the terms "die" and "chip" refer to a modular block containing an integrated circuit. In these examples, the term "integrated circuit" refers to an electronic circuit directly integrated and/or etched into an electronic component. Example of dies or chips include, without limitation, system-on-chips (SOCs), graphic processing units (GPUs), central processing units (CPUs), high-bandwidth memory (HBM) stacks, interface circuits, Serializer/Deserializer (SerDes) blocks, semiconductor chips, and/or any other suitable modular components with integrated circuits. In non-limiting examples, the term "three-dimensional integrated circuit" refers to a computing component that includes vertically stacked integrated circuits, such as vertically stacked dies.

In the example of FIG. 1, a macro cell, such as macro cells 110(1)-(N), includes one or more vertical die interconnects, such as vertical die interconnects 108(1)-(N), that vertically span the macro cell to transmit a data signal. In non-limiting example, the term "vertical die interconnect" refers to a vertical electrical connection that connects layers of a die and/or layers between multiple dies. Examples of vertical die interconnects include through-silicon vias (TSVs), bond pad vias (BPVs), microvias, and/or any other suitable type of electrical connection. In the example of FIG. 1, each of macro cells 110(1)-(N) also includes one or more isolation features configured to manage a power of the macro cell by controlling a transmission of the data signal and one or more flip-flops configured to control a timing of the transmission of the data signal through the at least one vertical die interconnect. In non-limiting examples, the term "flip-flop" refers to a memory device that is controlled by a clock signal. In these examples, a flip-flop can also be connected to Serial Data Out (SDO) and Serial Data In (SDI) signals to and from other devices.

In the example of FIG. 1, an integrated circuit, such as dies 106(1)-(3), includes a set of electronic circuits disposed on a semiconductor material, such as silicon. In this example, each of dies 106(1)-(3) also includes two or more macro cells, such as macro cells 110(1)-(N), electronically integrated with the set of electronic circuits on the semiconductor material. In this example, vertical die interconnects 108(1)-(N) vertically span dies 106(1)-(3) to transmit a data signal. Although not illustrated in FIG. 1, isolation features can be configured to manage a power of dies 106(1)-(3) by controlling a transmission of the data signal, and flip-flops can be configured to control a timing of the transmission of the data signal through vertical die interconnects 108(1)-(N) of macro cells 110(1)-(N).

In the example of FIG. 1, three-dimensional integrated circuit 100 includes a base die 102. In some examples, base die 102 can also include a semiconductor material. In some examples, base die 102 and dies 106(1)-(3) comprise a rigid material holding a specific form. In some examples, the semiconductor material includes one or more portions acting as an insulator and one or more portions acting as a conductor. In the example of FIG. 1, three-dimensional integrated circuit 100 also includes a stack 104 of dies 106(1)-(3) electronically coupled to an interface of base die 102, wherein dies 106(1)-(3) include macro cells 110(1)-(N). In this example, vertical die interconnects 108(1)-(N) vertically span dies 106(1)-(3) to interconnect to other dies transmit a data signal. In additional examples, vertical die interconnects 108(1)-(N) can transmit the data signal within layers of each of dies 106(1)-(3).

In some examples, three-dimensional integrated circuit 100 can be all or a portion of a computing system that generally represents any type or form of computing system or computing device with electronic components to perform computing functions. Examples of computing systems include, without limitation, chiplets, printed circuit boards (PCBs), processors, and/or other electronic components or combinations of the same. Additional examples of computing systems include, without limitation, laptops, tablets, desktops, servers, cellular phones, Personal Digital Assistants (PDAs), multimedia players, embedded systems, wearable devices (e.g., smart watches, smart glasses, etc.), smart vehicles, so-called Internet-of-Things devices (e.g., smart appliances, etc.), gaming consoles, servers, variations or combinations of one or more of the same, a portion of one or more of the same, or any other suitable computing device.

Many other devices or subsystems can be connected to three-dimensional integrated circuit 100 in FIG. 1 or similar computing systems. Conversely, the components and devices illustrated in FIG. 1 need not be present to practice the implementations described and/or illustrated herein. The devices and subsystems referenced above can also be interconnected in different ways from that shown in FIG. 1. Three-dimensional integrated circuit 100 or related computing systems can also employ any number of software, firmware, and/or hardware configurations. For example, three-dimensional integrated circuit 100 can include additional cells, additional dies, additional stacks, and/or any other suitable computing components to carry out one or more of the functions described herein.

In one example, macro cells 110(1)-(N) are identically designed. In this example, macro cells 110(1)-(N) are general purpose cells that are interchangeable. In one example, dies 106(1)-(3) are identically designed. In this example, dies 106(1)-(3) are vertically stacked by electronically coupling an interface of die 106(1) with an interface of die 106(2) such that one or more of macro cells 110(1)-(N) of die 106(1) is aligned to one or more of macro cells 110(1)-(N) of die 106(2). Similarly, an interface of die 106(2) is electronically coupled to an interface of die 106(3) such that one or more of macro cells 110(1)-(N) of die 106(2) is aligned to one or more of macro cells 110(1)-(N) of die 106(3). In the example of FIG. 1, a bottom interface of die 106(2) is coupled to a top interface of die 106(1), and a bottom interface of die 106(3) is coupled to a top interface of die 106(2). Additionally, stack 104 is electronically coupled to the interface of base die 102 by electronically coupling a bottom interface of die 106(1) with the interface of base die 102 such that one or more of macro cells 110(1)-(N) of die 106(1) is aligned to macro cells 110(1)-(N) of base die 102. In other examples, dies 106(1)-(3) can include variations between dies, macro cells, and/or other components. For example, dies 106(1)-(3) can be designed differently from each other while incorporating macro cells 110(1)-(N) to send signals between dies 106(1)-(3). In the example of FIG. 1, vertical die interconnects 108(1)-(N) can connect various layers inside each of dies 106(1)-(3), with some of vertical die interconnects 108(1)-(N) passing through each of dies 106(1)-(3) to send signals through stack 104.

In some examples, base die 102 includes one or more output cells, such as output cell 112, configured to transmit the data signal to stack 104. In these examples, base die 102 also includes one or more input cells, such as input cell 114, configured to receive the data signal from stack 104. In some examples, output cell 112 and input cell 114 are different cells, with different logic designs. In other examples, output cell 112 and input cell 114 are the same cell designs, such as by using a design of macro cells 110(1)-(N), which may be identical. In one example, base die 102 is configured to broadcast data to dies 106(1)-(3) of stack 104, wherein output cell 112 broadcasts data to die 106(2) through one or more of vertical die interconnects 108(1)-(N) of one or more of macro cells 110(1)-(N) of die 106(1). In this example, base die 102 broadcasts data to die 106(3) through one or more of macro cells 110(1)-(N) of both die 106(1) and die 106(2). Similarly, in some examples, base die 102 is configured to receive data from dies 106(1)-(3) of stack 104, wherein input cell 114 receives data from die 106(2) through one or more of macro cells 110(1)-(N) of die 106(1) and data from die 106(3) through one or more of macro cells 110(1)-(N) of both die 106(1) and die 106(2).

In one example, macro cells 110(1)-(N) of each of dies 106(1)-(3) are configured to transmit the data signal to a vertically adjacent die and receive the data signal from the vertically adjacent die. For example, macro cells 110(1)-(N) can transmit signals between base die 102 and die 106(1), between die 106(1) and 106(2), and between die 106(2) and 106(3). In the example of FIG. 1, die 106(3) is an outermost die of stack 104, and an isolation feature of macro cells 110(1)-(N) of die 106(3) can manage the power of die 106(3) by disabling an output driver for die 106(3). In some examples, the isolation feature electrically isolates the integrated circuit of each of dies 106(1)-(3) from vertically adjacent integrated circuits by disabling a driver for vertical die interconnects 108(1)-(N), disabling an output driver for the integrated circuit, disabling a faulty vertical die interconnect, and/or disabling a faulty macro cell. In other words, isolation features of macro cells 110(1)-(N) can improve power management such that an integrated circuit does not come out of isolation and drive signals until the next die is powered up and ready to receive. In these examples, isolation features can also turn off local macro cells of each of dies 106(1)-(3) when there is no vertically adjacent die to receive the output signal, such as for die 106(3). By disabling a driver for vertical die interconnects 108(1)-(N), disabling an output driver for the integrated circuit, disabling a faulty vertical die interconnect, and/or disabling a faulty macro cell, the isolation features can adjust for vertical die interconnects that are shorted to adjacent vertical die interconnects or for adjacent dies that are powered down. In additional examples, additional vertical die interconnects incorporated into dies 106(1)-(3) can detect when an adjacent die powers up, which then enables the isolation features to stage power up for the local dies to begin data transmission.

Figure 2:
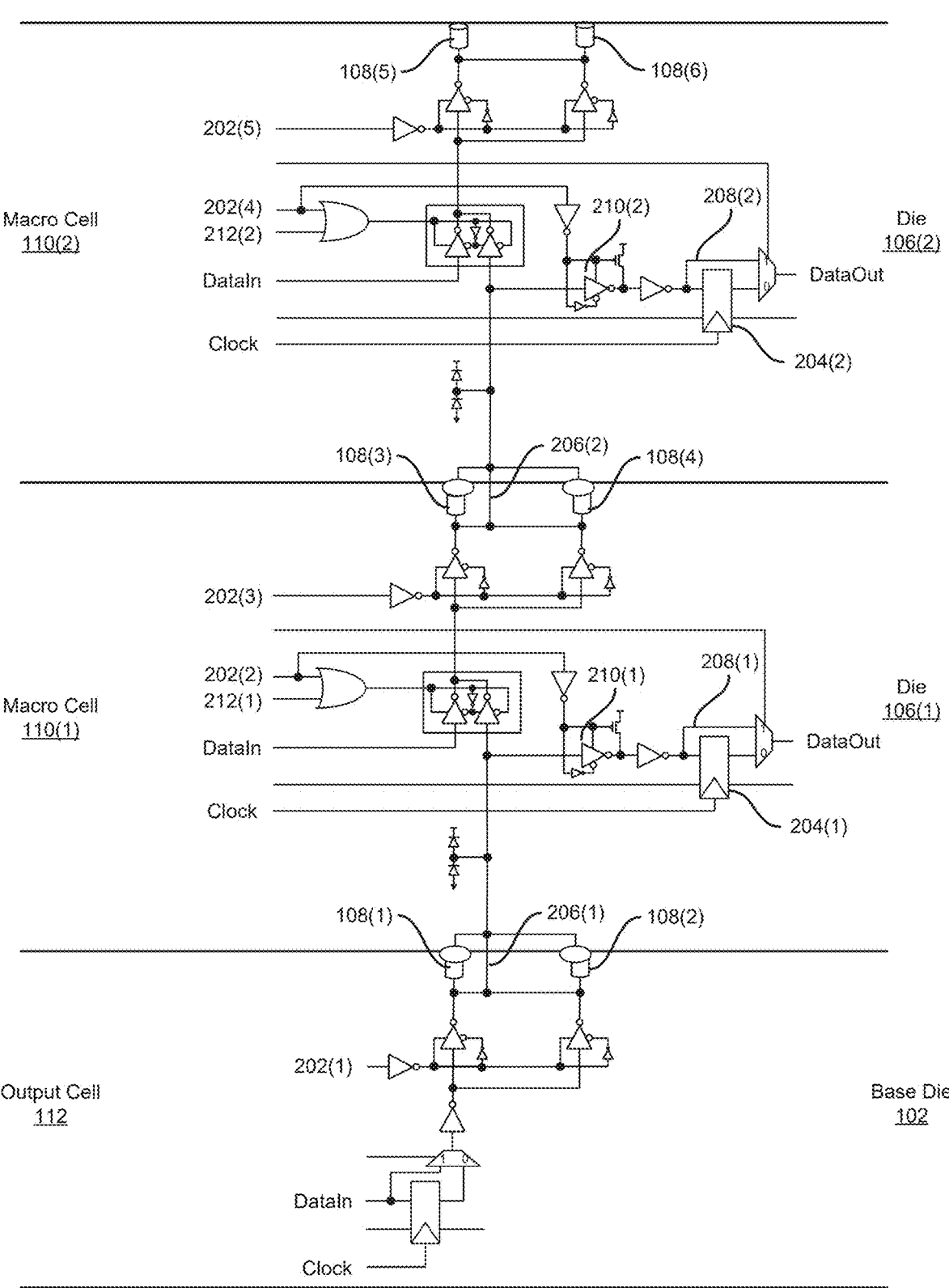
FIG. 2 illustrates a circuit diagram of an exemplary base die broadcasting data to an exemplary die stack through the use of exemplary multi-purpose macro cells.

FIG. 2 illustrates a circuit diagram of exemplary base die 102 broadcasting data to exemplary die stack 104 through the use of exemplary macro cells 110(1)-(2). In the example of FIG. 2, output cell 112 of base die 102 is configured to transmit data signals to macro cell 110(1) of die 106(1) through a pair of vertical die interconnects 108(1)-(2). Similarly, macro cell 110(1) of die 106(1) is configured to transmit received data signals out to macro cell 110(2) of die 106(2) through vertical die interconnects 108(3)-(4). In this example, macro cell 110(2) is configured to transmit data signals out through vertical die interconnects 108(5)-(6) for any additionally stacked dies, such as die 106(3) of FIG. 1. In other words, each of macro cells 110(1)-(2) is configured to output the data signal through vertical die interconnects 108(3)-(5) to the vertically adjacent integrated circuit of dies 106(2)-(3). In the example of FIG. 2, vertical die interconnects 108(1), 108(3), and 108(5) may be positioned to vertically align. Similarly, vertical die interconnects 108(2), 108(4), and 108(6) may be positioned to vertically align, thereby transmitting signals from one die to the next. In some examples, macro cells 110(1)-(2) can also be configured to transmit data signals from die 106(2) down to base die 102 in the opposite direction.

In the example of FIG. 2, vertical die interconnects 108(1)-(6) are dual vertical die interconnects configured to provide redundancy against an open-circuit fault. In this example, a failure of one vertical die interconnect, such as vertical die interconnect 108(3), does not impede the data signal transmission through another vertical die interconnect, such as vertical die interconnect 108(4). In this example, macro cell 110(1) would not require a redundant vertical die interconnect or set of vertical die interconnects to transmit data signals. Additionally, the dual vertical die interconnects include pass gates 206(1)-(2) configured to bypass a vertical die interconnect short. In this example, pass gate 206(1) can bypass a short between vertical die interconnects 108(3)-(4). In alternate examples, vertical die interconnects 108(1)-(6) can include single vertical die interconnects or any other suitable vertical die interconnect design. For example, macro cell 110(1) may connect to output cell 112 with single vertical die interconnects but then connect to macro cell 110(2) with dual vertical die interconnects.

In the example of FIG. 2, isolation features 202(2)-(5) manage the power of macro cells 110(1)-(2) by isolating the data signal at a local integrated circuit and/or routing the data signal based on a type of the data signal. For example, an isolation feature 202(1) of output cell 112 can hold a data signal and transmit when base die 102 determines die 106(1) is powered up. Similarly, isolation feature 202(3) is configured to manage a power of macro cell 110(1) by controlling a transmission of the data signal, such as by holding outgoing data signals before transmitting to macro cell 110(2). In this example, isolation feature 202(3) electrically isolates the integrated circuit of macro cell 110(1) from the vertically adjacent integrated circuit of macro cell 110(2). In the example of FIG. 2, isolation feature 202(5) may then control further transmission of the data signal by managing the power of die 106(2) as the outermost die of FIG. 2 to prevent macro cell 110(2) from driving the data signal out from die 106(2). In non-limiting examples, isolation features 202(1)-(5) can be configured to disable a driver for vertical die interconnects 108(1)-(6), disabling an output driver for the integrated circuit of macro cells 110(1)-(2) and/or output cell

112, disabling a faulty vertical die interconnect, disabling a faulty macro cell of macro cells 110(1)-(2), and/or any other suitable methods of electrical isolation.

In the example of FIG. 2, isolation feature 202(2) and a multiplexing signal 212(1) can drive the data signal through vertical die interconnects 108(3)-(4) to the vertically adjacent integrated circuit of die 106(2). In non-limiting examples, the terms "multiplexing" and "muxing" refer to a process of combining multiple input signals to an output signal. In this example, the combination of isolation features 202(20) and multiplexing signal 212(1) can drive the data signal received through vertical die interconnects 108(1)-(2) directly on toward vertical die interconnects 108(3)-(4), without further modification of the data signal. Similarly, isolation feature 202(4) and a multiplexing signal 212(2) are configured to drive the data signal to vertical die interconnects 108(5)-(6). In this example, isolation feature 202(5) may then prevent the data signal from proceeding further with no additional dies beyond die 106(2).

In the example of FIG. 2, flip-flops 204(1)-(2) are configured to control a timing of the transmission of the data signal through vertical die interconnects 108(3)-(5). In this example, flip-flops 204(1)-(2) control the timing of the transmission of the data signal by capturing the received data signal, through receiving the signal and temporarily storing a state, prior to sending the data signal to the local integrated circuits of dies 106(1)-(2). For example, for high-frequency and/or high-speed synchronous data signals, stricter timing controls may be needed to ensure timing closure between dies 106(1)-(2) and base die 102. Additionally, macro cells 110(1)-(2) include flip-flop bypasses 208(1)-(2) that are configured to bypass flip-flops 204(1)-(2), respectively. In this example, data signals that are static, asynchronous, low-speed, and/or low-frequency may not require timing controls or may not be able to be captured. In this example, these data signals can bypass flip-flops 204(1)-(2) directly to the local integrated circuits of dies 106(1)-(2).

In the example of FIG. 2, macro cells 110(1)-(2) include receivers 210(1)-(2), respectively, that are configured to send the data signal to the local integrated circuits of dies 106(1)-(2). In this example, receivers 210(1)-(2) can receive the data signal before passing it to flip-flops 204(1)-(2). In some examples, the local integrated circuits of dies 106(1)-(2) can perform additional processing before driving the data signal on to the next layer. In these examples, the local integrated circuits can send the transformed data signals back to macro cells 110(1)-(2) (e.g., "DataIn") to be output. In other examples, the local integrated circuits can send additional signals to macro cells 110(1)-(2), which can then multiplex the additional signals with the originally received data signal before output to the next layer. In various non-limiting examples, the output data signal from one of macro cells 110(1)-(2) can include the original data signal, a buffered version of the original data signal, a version of the data signal modified by the local integrated circuit, a new synchronous signal, a new asynchronous signal, and/or a different new data signal to the next vertically adjacent die.

Figure 3:
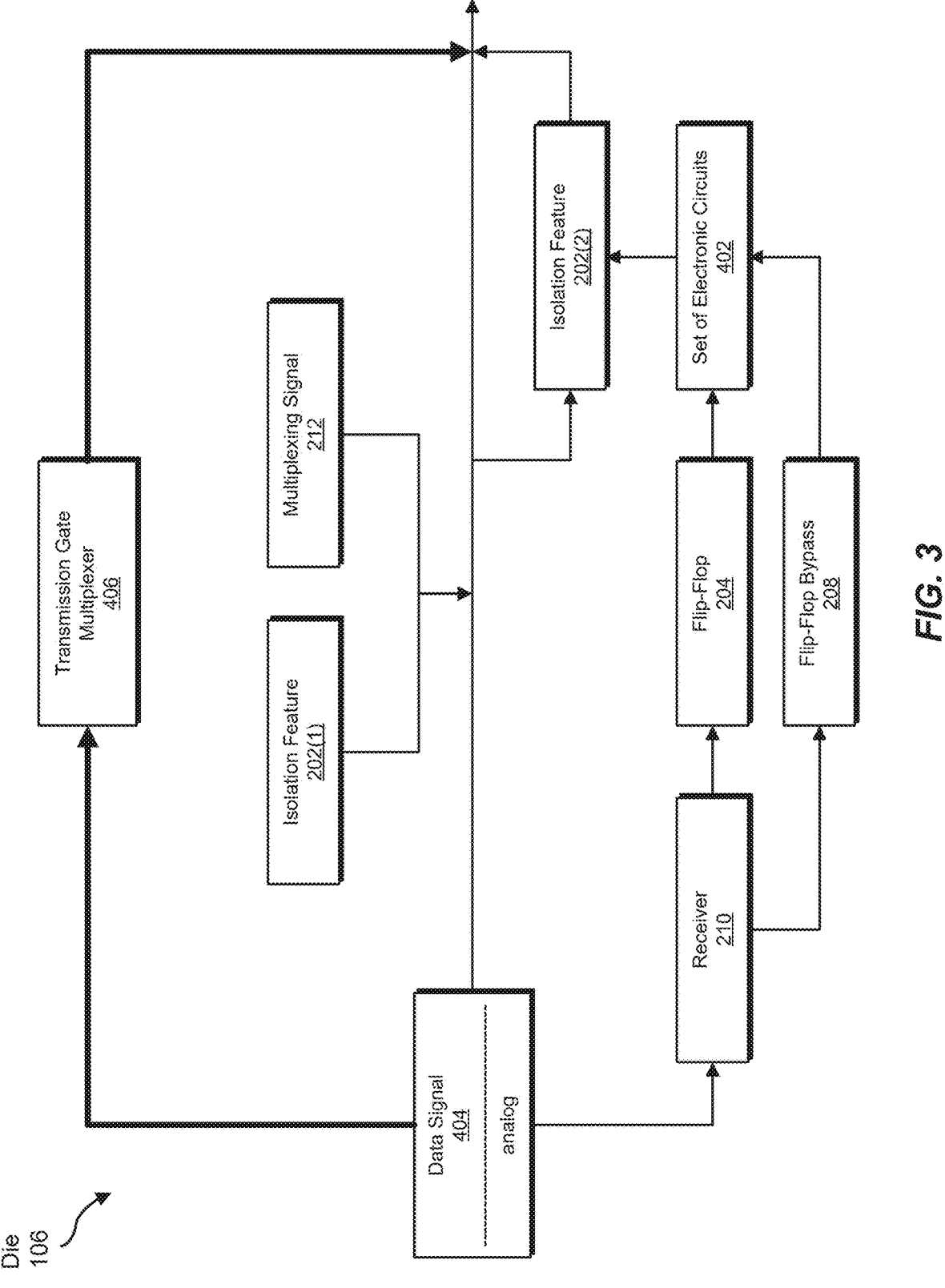
FIG. 3 is a block diagram illustrating an example processing of analog data through an example die using an example multi-purpose macro cell.

FIG. 3 is a block diagram illustrating an example processing of an analog data signal 404 through an example die 106 using an example multi-purpose macro cell. As shown in FIG. 3, the macro cell of die 106 can include a transmission gate multiplexer 406 configured to process analog signals by bypassing a circuit of the macro cell, as illustrated by the wider arrows. In this example, transmission gate multiplexer 406 is configured to multiplex analog data signal 404 to output analog data signal 404 through vertical die interconnects of die 106 to a vertically adjacent integrated circuit. By bypassing the circuit of the macro cell through transmission gate multiplexer 406, analog data signal 404 avoids inversions in the circuit of the macro cell. In this example, data signal 404 also bypasses a set of electronic circuits 402 of die 106, along with other circuitry. In some examples, the macro cell and/or transmission gate multiplexer 406 can implement a tri-state buffer to handle both analog and digital or static signals on a shared bus. In additional examples, the macro cell can use an alternate type of multiplexer to handle analog signals.

Figure 4:
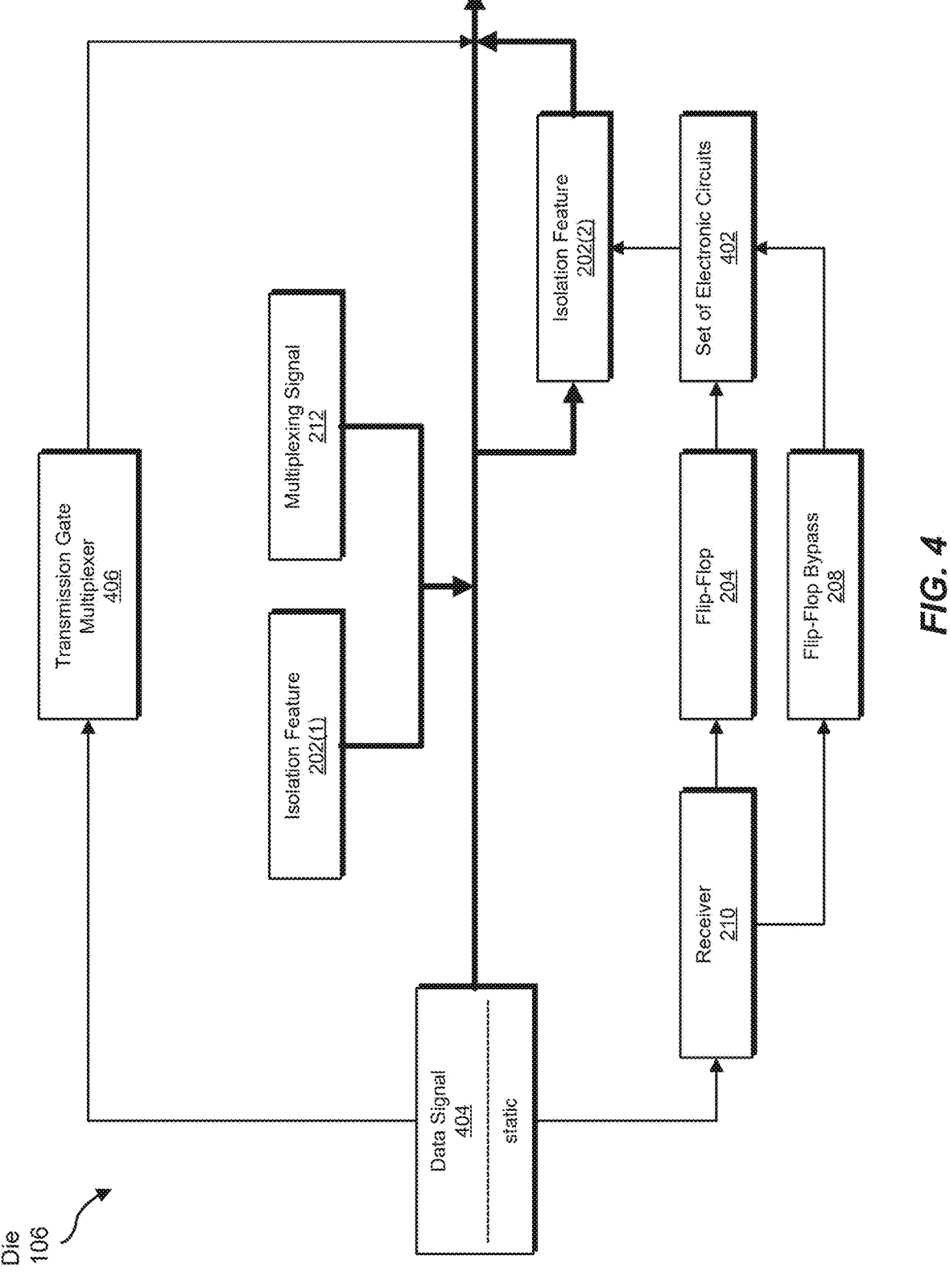
FIG. 4 is a block diagram illustrating an example processing of static data through an example die using an example multi-purpose macro cell.

FIG. 4 is a block diagram illustrating an example processing of a static data signal 404 through die 106 using an example multi-purpose macro cell. As shown in FIG. 4, isolation feature 202(1) manages the power of the macro cell of die 106 by routing data signal 404 based on a type of the data signal (e.g., a static data signal). In this example, isolation feature 202(1) and a multiplexing signal 212 drive data signal 404 through the vertical die interconnects of die 106 to the next vertically adjacent integrated circuit. Additionally, in this example, isolation feature 202(2) is configured to hold data signal 404 until the next vertically adjacent integrated circuit is available or powered up. In this example, data signal 404 bypasses set of electronic circuits 402 of die 106 and is output without modification by die 106.

Figure 5:
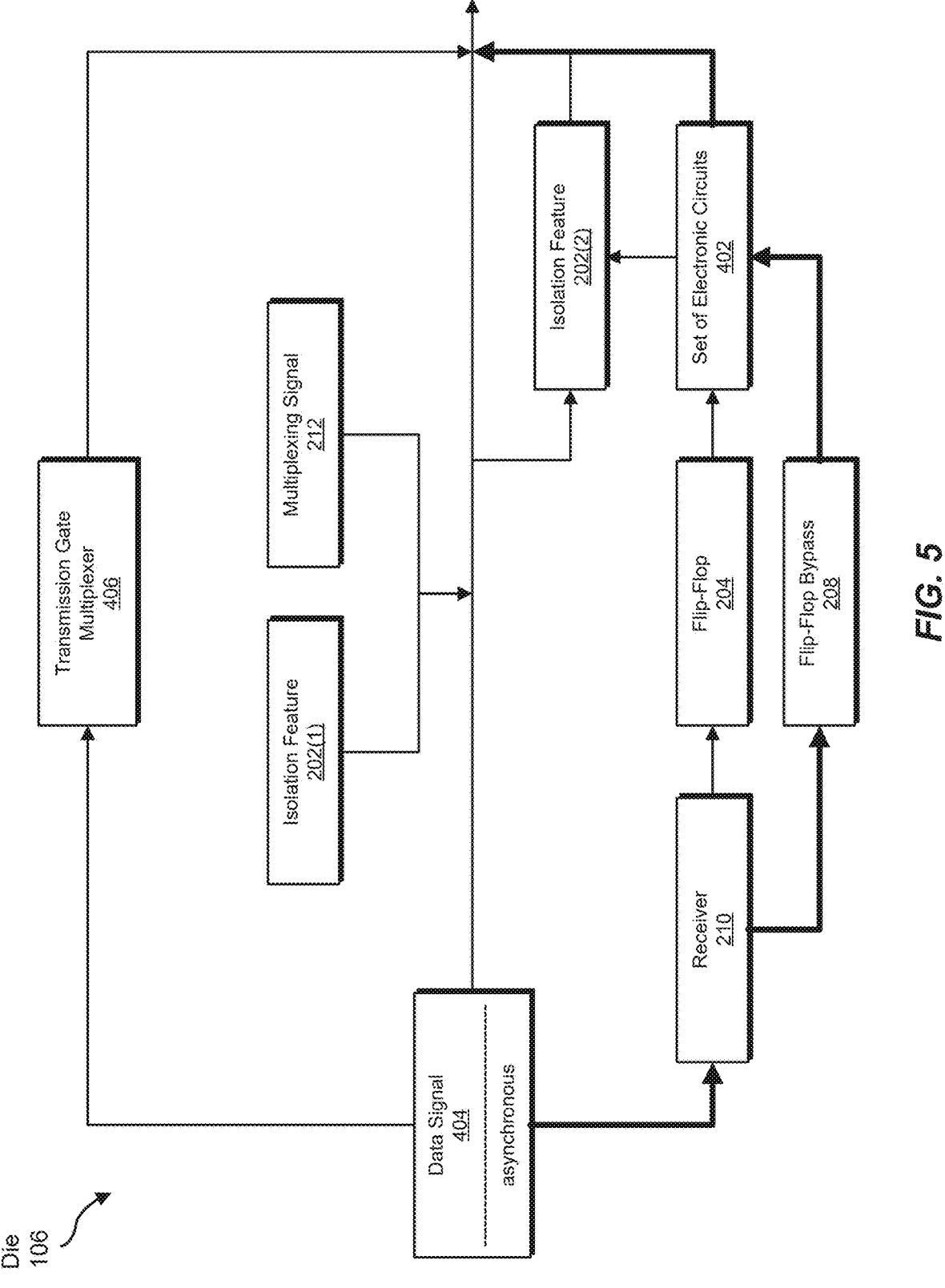
FIG. 5 is a block diagram illustrating an example processing of asynchronous data through an example die using an example multi-purpose macro cell.

FIG. 5 is a block diagram illustrating an example processing of an asynchronous data signal 404 through die 106 using an example multi-purpose macro cell. As illustrated in FIG. 5, data signal 404 is an asynchronous signal that is received by a receiver 210. In this example, receiver 210 may then determine whether to send data signal 404 to a flip-flop 204 or to a flip-flop bypass 208. In this example, data signal 404 may not require capturing, and flip-flop bypass 208 is configured to bypass flip-flop 204. In this example, flip-flop bypass 208 is further configured to route asynchronous data signal 404 to set of electronic circuits 402 of die 106. In this example, set of electronic circuits 402 further modifies or processes data signal 404 before sending it out through the vertical die interconnects of the macro cell.

Figure 6:
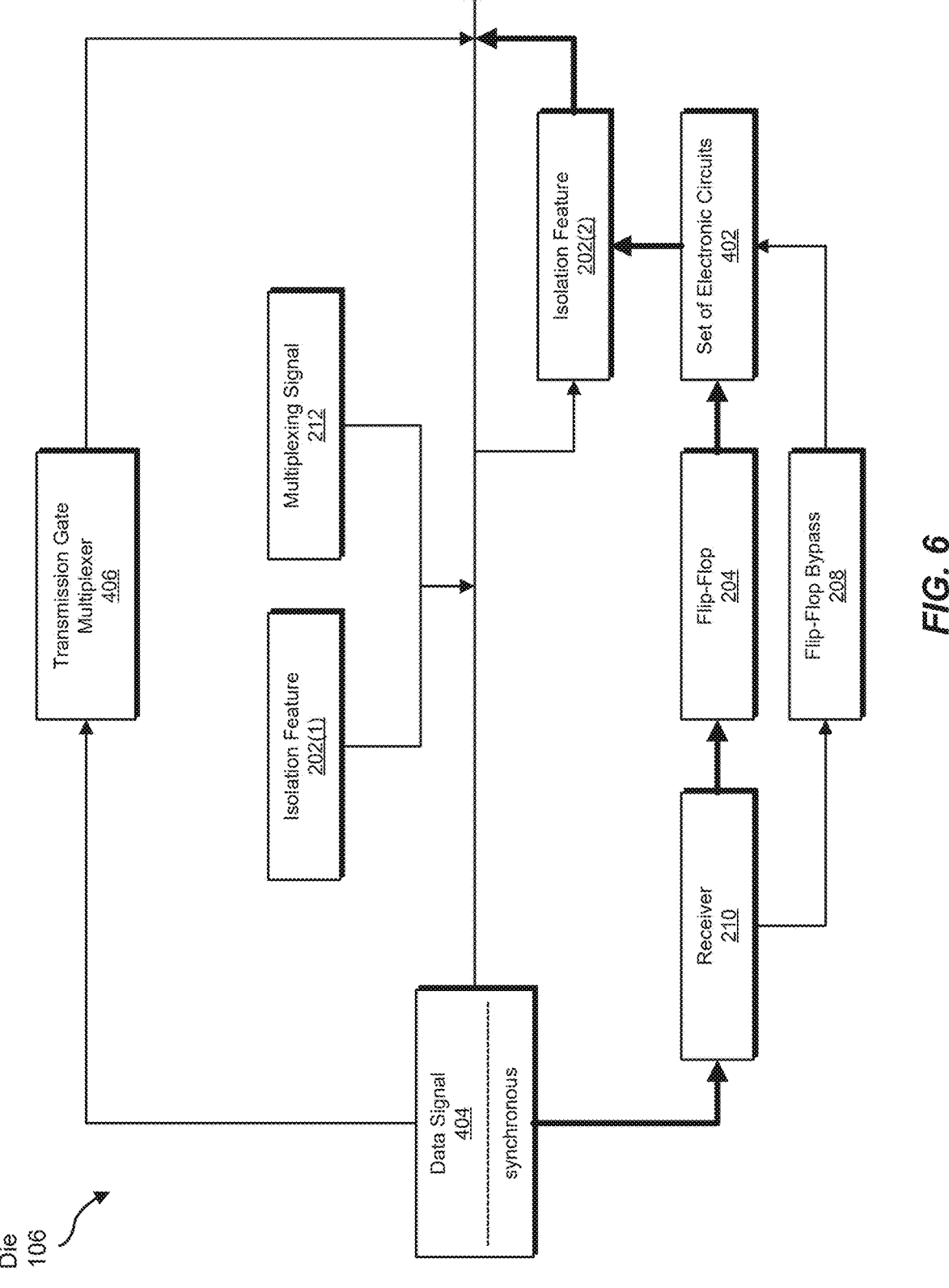
FIG. 6 is a block diagram illustrating an example processing of synchronous data through an example die using an example multi-purpose macro cell.

FIG. 6 is a block diagram illustrating an example processing of a synchronous data signal 404 through die 106 using an example multi-purpose macro cell. In the example of FIG. 6, receiver 210 first receives data signal 404. In this example, data signal 404 may require capturing and state data, and flip-flop 204 then captures data signal 404 before passing it to set of electronic circuits 402 of die 106. In this example, set of electronic circuits 402 further modifies or processes data signal 404 before sending it out through the vertical die interconnects of the macro cell. In alternate examples, various types of data signals can be processed similarly to any of FIGS. 3-6 through macro cells designed similarly to macro cells 110(1)-(2) of FIG. 2.

Figure 7:
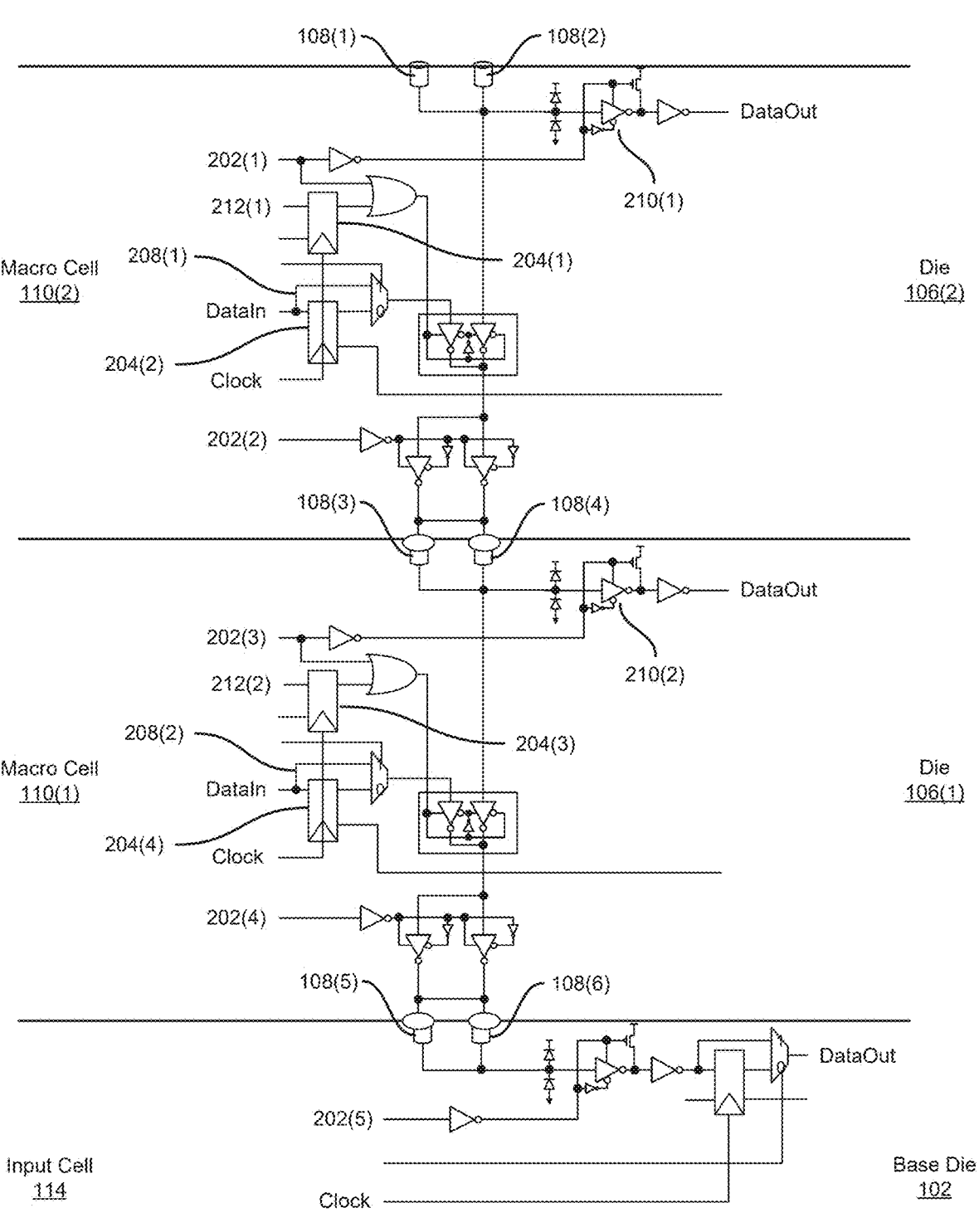
FIG. 7 illustrates a circuit diagram of an exemplary base die receiving data from an exemplary die stack through the use of exemplary multi-purpose macro cells.

FIG. 7 illustrates a circuit diagram of exemplary base die 102 receiving data from exemplary die stack 104 through the use of exemplary macro cells 110(1)-(2). In the example of FIG. 7, input cell 114 of base die 102 is configured to receive data signals from macro cell 110(1) of die 106(1) through a pair of vertical die interconnects 108(5)-(6). Similarly, macro cell 110(1) of die 106(1) is configured to receive data signals from macro cell 110(2) of die 106(2) through vertical die interconnects 108(3)-(4) before sending those data signals to base die 102. In this example, macro cell 110(2) is configured to receive data signals from vertical die interconnects 108(1)-(2) for any additionally stacked dies, such as die 106(3) of FIG. 1. In the example of FIG. 7, vertical die interconnects 108(1), 108(3), and 108(5) may be positioned to vertically align. Similarly, vertical die interconnects 108(2), 108(4), and 108(6) may be positioned to vertically align, thereby transmitting signals from one die to the next.

In the example of FIG. 7, isolation features 202(1)-(4) manage the power of macro cells 110(1)-(2) by isolating a data signal at a local integrated circuit and/or routing the data signal based on a type of the data signal. In this example, isolation features 202(1) and 202(3) are configured to route the data signal to the local integrated circuits (e.g., "DataOut") of dies 106(1)-(2) and/or to route the data signal down toward the next layer. For example, isolation features 202(1) and 202(3) in combination with multiplexing signals 212(1)-(2) can combine local data from dies 106(1)-(2) with the data signal to be passed to the next layer. In this example, receivers 210(1)-(2) are configured to receive the data signal from vertical die interconnects 108(1)-(4) and send the data signal to the local integrated circuits. In some examples, isolation features 202(2) and 202(4) are configured to isolate the data signal prior to sending to the next layer. Similarly, isolation feature 202(5) can be configured to isolate the data signal before receiving at base die 102.

In the example of FIG. 7, flip-flops 204(2) and 204(4) control the timing of the transmission of the data signal by capturing a signal from the local integrated circuits (e.g., "DataIn"). Additionally, flip-flop bypasses 208(1)-(2) are configured to bypass flip-flops 204(2) and 204(4). In this example, flip-flops 204(1) and 204(3) provide additional tight timing controls when determining whether to multiplex signals for output, which may be particularly useful for high-frequency synchronous signal outputs.

Although illustrated as an alternative design, macro cells 110(1)-(2) of FIG. 7 can be replaced by similar designs to macro cells 110(1)-(2) of FIG. 2, and vice versa, or with any other suitable design as described herein. In some examples, dies 106(1)-(2) can include a different macro cell design for transmitting data up the stack and transmitting data down the stack. In other examples, dies 106(1)-(2) can include similar designs for macro cells transmitting data up the stack and transmitting data down the stack. In further examples, dies 106(1)-(2) can use the same macro cells for transmitting data both up and down the stack. In the examples of FIGS. 2 and 7, diodes positioned between input vertical die interconnects and receivers of macro cells 110(1)-(2) can provide electrostatic discharge (ESD) protection. Although illustrated as including ESD protection diodes in FIGS. 2 and 7, other examples of the disclosed macro cells can include alternate elements for ESD protection or no ESD protection. Various other elements of FIGS. 2 and 7 can be included, swapped with different elements, positioned differently, and/or not included in other embodiments of the disclosed macro cells.

Figure 8:
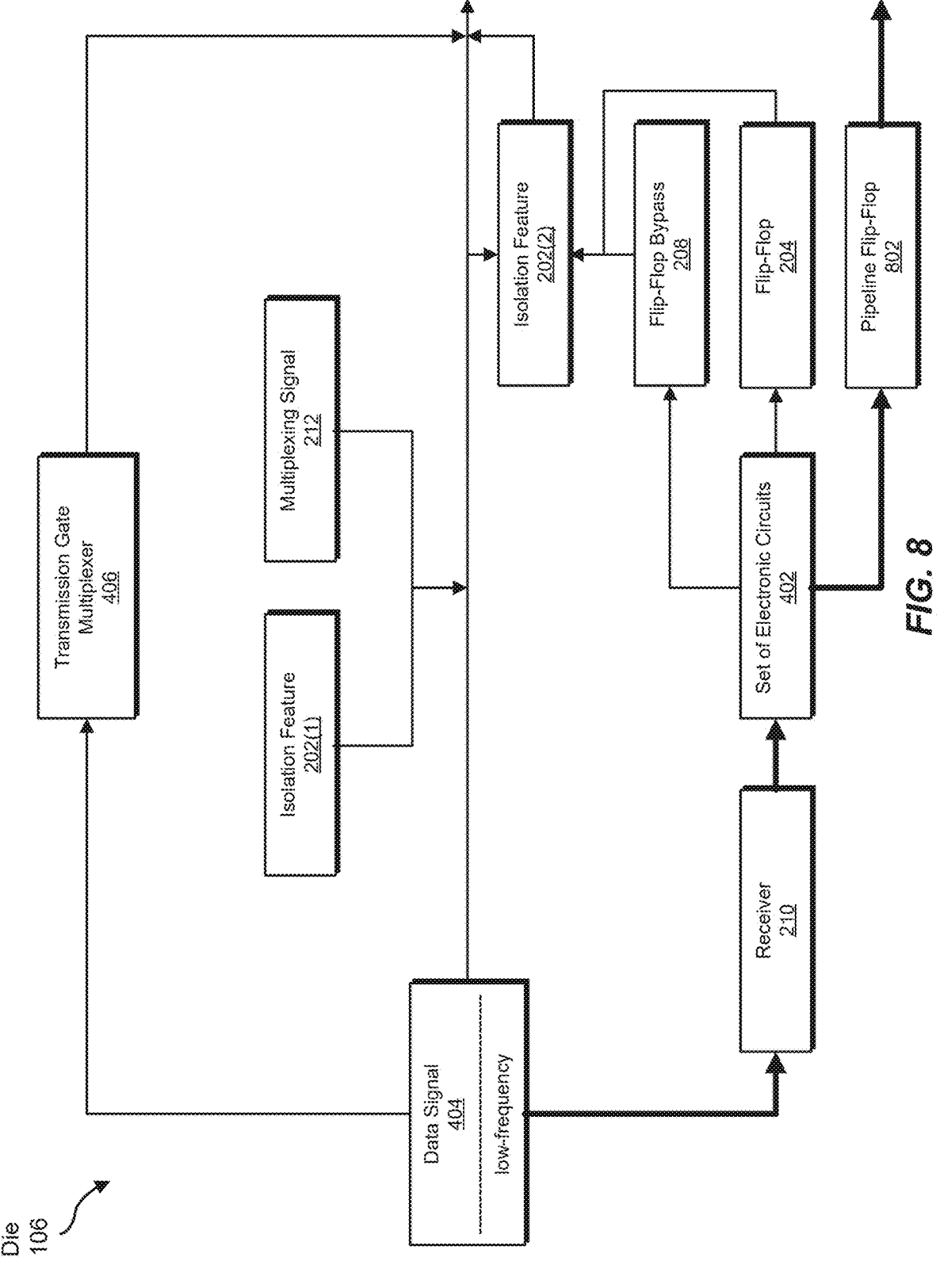
FIG. 8 is a block diagram illustrating an example processing of low-frequency data through an example die using an example multi-purpose macro cell.

FIG. 8 is a block diagram illustrating an example processing of a low-frequency data signal 404 through die 106 using an example multi-purpose macro cell. The macro cell illustrated in FIG. 8 can represent a similar design to macro cells 110(1)-(2) of FIG. 7. As shown in FIG. 8, receiver 210 receives data signal 404 and sends it to set of electronic circuits 402 of die 106. In this example, set of electronic circuits 402 can transform the data signal and output the modified data signal to a pipeline flip-flop 802, which can then output the modified data signal to the macro cell or to the next integrated circuit of the stack. In this example, pipeline flip-flop 802 can be implemented on die 106 outside of the macro cell.

Figure 9:
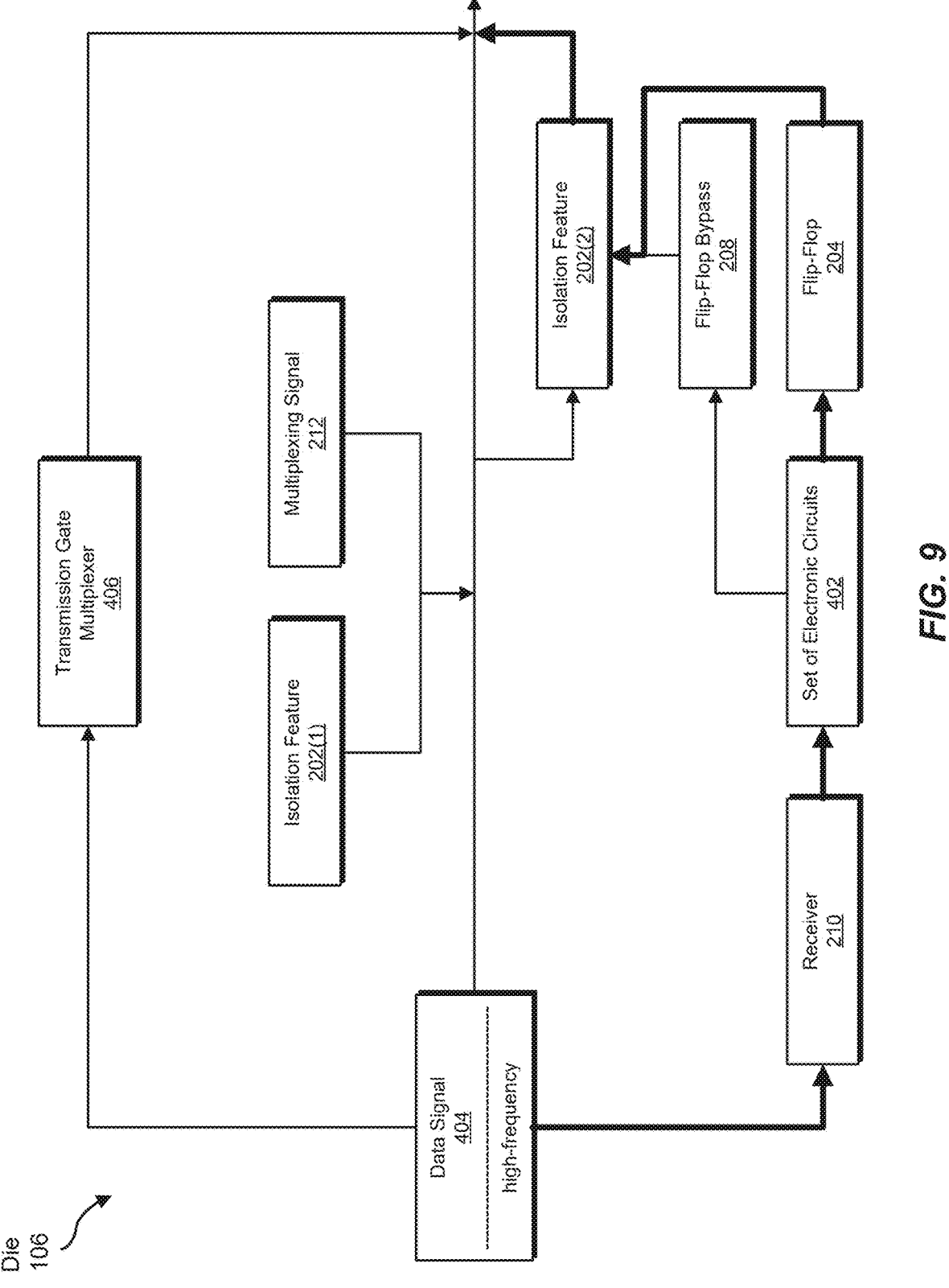
FIG. 9 is a block diagram illustrating an example processing of high-frequency data through an example die using an example multi-purpose macro cell.

FIG. 9 is a block diagram illustrating an example processing of a high-frequency data signal 404 through die 106 using an example multi-purpose macro cell. In the example of FIG. 9, receiver 210 receives data signal 404 from the vertical die interconnects of the macro cell and sends data signal 404 to set of electronic circuits 402. In this example, set of electronic circuits 402 modifies data signal 404 and passes it to flip-flop 204 based on data signal 404 being a high-frequency signal that should be captured to control the timing. In alternate examples, set of electronic circuits 402 can send data signal 404 to flip-flop bypass 208 to bypass flip-flop 204. In other examples, set of electronic circuits 402 can send a signal from the local integrated circuit of die 106 to be multiplexed with data signal 404. In this example, flip-flop 204 can capture the local signal to align with a timing of data signal 404. Furthermore, flip-flop 204 and/or flip-flop bypass 208 is configured to send data signal 404 to isolation features 202(2), which is configured to isolate data signal 404 until the next adjacent die is detected or the next adjacent die is determined to be power up.

The disclosed embodiments can also include a method for manufacturing, assembling, using, adjusting, or otherwise configuring or creating the systems and apparatuses presented herein. The method can be performed by any individual and/or by any suitable type or form of manual and/or automated apparatus. For example, one or more of the systems described herein can form one or more vertical die interconnects to vertically span a macro cell for data transmission. Additionally, one or more of the systems described herein can configure one or more isolation features of the macro cell to manage a power of the macro cell by controlling data transmission. Furthermore, one or more of the systems described herein can configure one or more flip-flops to control a timing of the data transmission through the vertical die interconnects. In additional examples, one or more of the systems described herein can integrate other elements, such as pass gates, flip-flop bypasses, receivers, and/or transmission gate multiplexers to handle routing of various data signals through the macro cell.

In some embodiments, one or more of the systems described herein can integrate macro cells with an integrated circuit or die. In some embodiments, the method of manufacturing can include disposing a set of electronic circuits on a semiconductor material of the integrated circuit. In these embodiments, the macro cells can be electronically integrated with the set of electronic circuits on the semiconductor material. For example, as illustrated in FIG. 1, dies 106(1)-(3) include electronic circuits constructed on silicon material that interface with other dies, and macro cells 110(1)-(N) are integrated with dies 106(1)-(3) to transmit data up and down stack 104.

In some embodiments, one or more of the systems described herein can stack two or more dies on a base die of a three-dimensional integrated circuit. In these embodiments, one or more of the systems described herein can combine the dies as a stack, such as through bonding. In some examples, the disclosed method can stack dies 106 (1)-(3) of FIG. 1 by bonding dies 106(1)-(3) in stack 104 to each other and bonding stack 104 to base die 102 using die bonding. In some examples, the term "die bonding" refers to a method of attaching a die to a substrate or to another die. Examples of die bonding include, without limitation, direct bonding, hybrid bonding, copper-to-copper bonding, surface activated bonding, adhesive bonding, variations or combinations of one or more of the same, and/or any other suitable method for attaching dies. In these examples, the disclosed method can stack and bond dies 106(1)-(3) by matching the placement of vertical die interconnects 108(1)-(N) to ensure vertical die interconnects 108(1)-(N) can transmit data signals between dies.

In some embodiments, the disclosed macro cells can be used in various devices, such as stacking caches, static random-access memory (SRAM) components, dynamic random-access memory (DRAM) components, electrically erasable programmable read-only memory (EEPROM) components, graphic processing units (GPUs), central processing units (CPUs), input/output (I/O) interfaces, and/or any other suitable computing components. In some embodiments, the disclosed macro cells can be incorporated into a single master device, with vertical die interconnects connecting to different layers of the master device.

As described above, the disclosed apparatuses and systems improve the design of macro cells to enable flexible data signal routing. Accordingly, the implementations and systems described herein enable macro cells to reset, scan, or control signals synchronously or asynchronously up or down a die stack. The disclosed macro cells incorporate flip-flops to handle the timing of data transmission into and out of the macro cells. The disclosed macro cells also include flip-flop bypasses to enable asynchronous or low-frequency signals to bypass capturing by the flip-flops when not required. By incorporating a transmission gate multiplexer, the disclosed macro cells can also process analog signals. Additionally, the disclosed macro cells include isolation and multiplexing features that enable data signals to be quickly driven from a previous die to the next die, bypassing processing at a local die. The isolation features also improve the electrical isolation of dies from other dies to avoid noise spikes and to save power. With the use of electrical isolation, the disclosed macro cells do not need to be uniquely designed based on the position of the die in a stack.

The disclosed dies and integrated circuits are designed for different functions using the same macro components. For example, a three-dimensional integrated circuit of multiple stacked dies can utilize the same macro design on each die to process different types of signals, thereby enabling each macro cell to use the same schematics or layout to be used for a multitude of use cases, such as outputting signals from a local die, transforming a signal before output, and combining signals. The disclosed macro cells also enable processing of different types of data signals, such as high-frequency or low-frequency synchronous or asynchronous signals, high-speed or low-speed signals, static signals, and analog signals. Thus, the disclosed three-dimensional integrated circuit and macro cells can provide improved and flexible design for multiple input and output features.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

In some examples, all or a portion of exemplary three-dimensional integrated circuit 100 in FIG. 1 can represent portions of a cloud-computing or network-based environment. Cloud-computing environments can provide various services and applications via the Internet. These cloud-based services (e.g., software as a service, platform as a service, infrastructure as a service, etc.) can be accessible through a web browser or other remote interface. Various functions described herein can be provided through a remote desktop environment or any other cloud-based computing environment.

In some examples, all or a portion of exemplary three-dimensional integrated circuit 100 in FIG. 1 can represent portions of a mobile computing environment. Mobile computing environments can be implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments can have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein can be provided for a mobile computing environment and/or can interact with a mobile computing environment.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:
1. A macro cell comprising:
at least one vertical die interconnect that vertically spans the macro cell to transmit a data signal;
at least one isolation feature configured to manage a power of the macro cell by controlling a transmission of the data signal; and at least one flip-flop configured to control a timing of the transmission of the data signal through the at least one vertical die interconnect.

2. The macro cell of claim 1, wherein the at least one vertical die interconnect comprises a dual vertical die interconnect configured to provide redundancy against an open-circuit fault.

3. The macro cell of claim 2, wherein the dual vertical die interconnect comprises a pass gate configured to bypass a vertical die interconnect short.

4. The macro cell of claim 1, wherein the at least one isolation feature manages the power of the macro cell by at least one of:

isolating the data signal at a local integrated circuit; or routing the data signal based on a type of the data signal.

5. The macro cell of claim 4, wherein the at least one flip-flop controls the timing of the transmission of the data signal by at least one of:

capturing the data signal; or capturing a signal from the local integrated circuit.

6. The macro cell of claim 5, further comprising a flip-flop bypass configured to bypass the at least one flip-flop.

7. The macro cell of claim 4, further comprising a receiver configured to send the data signal to the local integrated circuit.

8. The macro cell of claim 1, further comprising a transmission gate multiplexer configured to process analog signals by bypassing a circuit of the macro cell.

9. An integrated circuit comprising:

a set of electronic circuits disposed on a semiconductor material; and at least one macro cell electronically integrated with the set of electronic circuits on the semiconductor material, wherein a macro cell comprises:

at least one vertical die interconnect that vertically spans the integrated circuit to transmit a data signal;

at least one isolation feature configured to manage a power of the integrated circuit by controlling a transmission of the data signal; and at least one flip-flop configured to control a timing of the transmission of the data signal through the at least one vertical die interconnect.

10. The integrated circuit of claim 9, wherein the set of electronic circuits is configured to:

receive the data signal from the at least one macro cell;

modify the data signal;

output the modified data signal to a pipeline flip-flop of the integrated circuit; and output the modified data signal to the at least one macro cell.

11. The integrated circuit of claim 9, wherein the data signal comprises at least one of:

a high-frequency signal;

a low-frequency signal;

a high-speed signal;

a low-speed signal;

a synchronous signal;

an asynchronous signal;

a static signal; or an analog signal.

12. The integrated circuit of claim 11, further comprising a transmission gate multiplexer configured to multiplex the analog signal to output the analog signal through the at least one vertical die interconnect to a vertically adjacent integrated circuit by bypassing the macro cell.

13. The integrated circuit of claim 12, wherein the at least one isolation feature and a multiplexing signal drive the data signal through the at least one vertical die interconnect to the vertically adjacent integrated circuit.

14. The integrated circuit of claim 12, wherein the at least one isolation feature electrically isolates the integrated circuit from the vertically adjacent integrated circuit by at least one of:

disabling a driver for the at least one vertical die interconnect;

disabling an output driver for the integrated circuit;

disabling a faulty vertical die interconnect; or disabling a faulty macro cell.

15. The integrated circuit of claim 12, wherein the at least one macro cell is further configured to output the data signal through the at least one vertical die interconnect to the vertically adjacent integrated circuit.

16. The integrated circuit of claim 11, further comprising a flip-flop bypass configured to route the asynchronous signal to bypass the at least one flip-flop.

17. A three-dimensional integrated circuit comprising:

a base die; and a stack of at least two dies electronically coupled to an interface of the base die, wherein a die comprises:

a set of electronic circuits disposed on a semiconductor material; and at least one macro cell electronically integrated with the set of electronic circuits on the semiconductor material, wherein a macro cell comprises:

at least one vertical die interconnect that vertically spans the die to interconnect to other dies to transmit a data signal;

at least one isolation feature configured to manage a power of the die by controlling a transmission of the data signal; and at least one flip-flop configured to control a timing of the transmission of the data signal through the at least one vertical die interconnect.

18. The three-dimensional integrated circuit of claim 17, wherein the base die comprises:

at least one output cell configured to transmit the data signal to the stack; and at least one input cell configured to receive the data signal from the stack.

19. The three-dimensional integrated circuit of claim 17, wherein the at least one macro cell is configured to:

transmit the data signal to a vertically adjacent die; and receive the data signal from the vertically adjacent die.

20. The three-dimensional integrated circuit of claim 17, further comprising an outermost die of the stack, wherein the isolation feature of the outermost die manages the power of the outermost die by disabling an output driver for the outermost die.

* * * * *